US012033230B2

United States Patent
Penrose et al.

(10) Patent No.: US 12,033,230 B2
(45) Date of Patent: Jul. 9, 2024

(54) DEVELOPMENT OF GEO-SPATIAL PHYSICAL MODELS USING HISTORICAL LINEAGE DATA

(71) Applicant: International Business Machines Corporation, Armonk, NY (US)

(72) Inventors: Andrew T. Penrose, Dublin (IE); Jitendra Singh, Noida (IN); Himanshu Gupta, New Delhi (IN); Vijay Arya, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1039 days.

(21) Appl. No.: 16/793,786

(22) Filed: Feb. 18, 2020

(65) Prior Publication Data

US 2021/0256176 A1    Aug. 19, 2021

(51) Int. Cl.
*G06N 20/00* (2019.01)
*G06F 30/27* (2020.01)
(Continued)

(52) U.S. Cl.
CPC .......... *G06Q 50/165* (2013.01); *G06F 30/27* (2020.01); *G06N 5/04* (2013.01); *G06N 20/00* (2019.01);
(Continued)

(58) Field of Classification Search
CPC ....... G06Q 50/165; G06F 30/27; G06F 16/29; G06N 5/04; G06N 20/00; G06T 17/05; G06T 2207/20081
See application file for complete search history.

(56) References Cited

U.S. PATENT DOCUMENTS

| | | | |
|---|---|---|---|
| 9,430,858 B1* | 8/2016 | Har | G06T 11/206 |
| 2010/0177095 A1* | 7/2010 | Watkins | G06T 17/05 |
| | | | 345/426 |

(Continued)

FOREIGN PATENT DOCUMENTS

| | | | | |
|---|---|---|---|---|
| CN | 102918591 A | * | 2/2013 | G10L 21/0208 |
| CN | 103069417 A | * | 4/2013 | G06F 16/2457 |

(Continued)

OTHER PUBLICATIONS

Ibrahim Sabek et al., "Machine Learning Meets Big Spatial Data", Proceedings of the VLDB Endowment, VLDB 2019, 45th International Conference on Very Large Data Bases, Aug. 26, 2017-Aug. 30, 2017, Published on Jan. 1, 2018, pp. 1982-1985, 6 pages, vol. 12, Issue No. 12, Elsevier.

(Continued)

*Primary Examiner* — Kandasamy Thangavelu
(74) *Attorney, Agent, or Firm* — Lily Neff

(57) ABSTRACT

One embodiment provides a method for recommending model characteristics to be used in developing a target geo-spatial physical model for a target geographic location utilizing historical lineage data corresponding to historical geo-spatial physical models, including: receiving information related to the target geographic location, wherein the information describes geographical and domain features of the target geographic location; identifying, using at least one similarity algorithm, at least one other geographic location that is similar to the target geographic location, wherein the at least one geographic location has at least one corresponding historical geo-spatial physical model; and recommending, using at least one machine-learning model and based upon the at least one other geographic location, initial model characteristics for developing and deploying the target geo-spatial physical model.

20 Claims, 2 Drawing Sheets

(51) Int. Cl.
*G06N 5/04* (2023.01)
*G06Q 50/16* (2012.01)
*G06T 17/05* (2011.01)
*G06F 16/29* (2019.01)

(52) U.S. Cl.
CPC .............. *G06T 17/05* (2013.01); *G06F 16/29* (2019.01); *G06T 2207/20081* (2013.01)

(56) References Cited

U.S. PATENT DOCUMENTS

| | | | |
|---|---|---|---|
| 2014/0142912 A1 | 5/2014 | Cipriani et al. | |
| 2015/0235153 A1* | 8/2015 | Du | G06Q 10/0635 705/7.28 |
| 2016/0343093 A1* | 11/2016 | Riland | G06Q 50/06 |
| 2016/0379388 A1 | 12/2016 | Rasco et al. | |
| 2017/0091627 A1* | 3/2017 | Terrazas | G06F 16/29 |
| 2017/0364733 A1* | 12/2017 | Estrada | G06V 20/13 |
| 2017/0371987 A1 | 12/2017 | Gibbas | |
| 2019/0171943 A1* | 6/2019 | Pao | G06F 16/29 |
| 2020/0233916 A1* | 7/2020 | Hoots | G06F 16/9538 |

FOREIGN PATENT DOCUMENTS

| | | | | |
|---|---|---|---|---|
| CN | 101317175 B | * | 10/2015 | ........... G06F 16/288 |
| CN | 103377476 B | * | 4/2018 | ............. G06T 7/344 |
| CN | 109154502 A | * | 1/2019 | ................ G01S 5/16 |
| WO | WO 2019132648 A1 | * | 7/2019 | ............. G06F 16/35 |

OTHER PUBLICATIONS

Trang Vopham et al., "Emerging trends in geospatial artificial intelligence (geoAI): potential applications for enviromental epidemiology", Environmental Health, 2018, 6 pages, BMC, Open Access, Springer Nature.

Bruno Silva et al., "JobPruner: A Machine Learning Assistant for Exploring Parameter Spaces in HPC Applications", Future Generation Computer Systems (FGCS), Feb. 2018, 14 pages, ResearchGate.

* cited by examiner

DEVELOPMENT OF GEO-SPATIAL PHYSICAL MODELS USING HISTORICAL LINEAGE DATA

BACKGROUND

Geo-spatial physical modeling is used in many different domains, for example, environmental, agriculture, land use, and the like domains. Geo-spatial physical models allow people to make predictions about the geographical location so that measures can be taken to optimize use of the location. For example, geo-spatial physical models can be used in weather forecasting, air pollution predicting, forest fire predicting, flood forecasting, soil moisture estimations, and the like. All of the forecasting and predictions provided by the physical model can be utilized to make the best use of the land or to prepare for adverse conditions that may affect the geographic location. For example, if the model predicts a level of soil moisture that is not optimal for one crop, then a farmer may choose to grow a different crop that is more suitable to the soil moisture conditions. Thus, the information provides a technique for the farmer to optimize the crop output. As another example, if the model predicts frequent flooding, the land may be used for something that is either not affected by flooding or that does not suffer significant damage during flooding conditions. Thus, geo-spatial physical models are very useful in different domains.

BRIEF SUMMARY

In summary, one aspect of the invention provides a method for recommending model characteristics to be used in developing a target geo-spatial physical model for a target geographic location utilizing historical lineage data corresponding to historical geo-spatial physical models, the method comprising: receiving information related to the target geographic location, wherein the information describes geographical and domain features of the target geographic location; identifying, using at least one similarity algorithm, at least one other geographic location that is similar to the target geographic location, wherein the at least one geographic location has at least one corresponding historical geo-spatial physical model; and recommending, using at least one machine-learning model and based upon the at least one other geographic location, initial model characteristics for developing and deploying the target geo-spatial physical model, wherein the initial model characteristics comprise (i) at least one input data source, (ii) at least one data transformation, (iii) at least one model, and (iv) at least one model performance parameter, wherein the at least one machine-learning model is trained using the historical lineage data of the historical geo-spatial physical models, the historical lineage data identifying model characteristics for a corresponding historical geo-spatial physical model.

Another aspect of the invention provides an apparatus for recommending model characteristics to be used in developing a target geo-spatial physical model for a target geographic location utilizing historical lineage data corresponding to historical geo-spatial physical models, the method comprising: at least one processor; and a computer readable storage medium having computer readable program code embodied therewith and executable by the at least one processor, the computer readable program code comprising: computer readable program code configured to receive information related to the target geographic location, wherein the information describes geographical and domain features of the target geographic location; computer readable program code configured to identify, using at least one similarity algorithm, at least one other geographic location that is similar to the target geographic location, wherein the at least one geographic location has at least one corresponding historical geo-spatial physical model; and computer readable program code configured to recommend, using at least one machine-learning model and based upon the at least one other geographic location, initial model characteristics for developing and deploying the target geo-spatial physical model, wherein the initial model characteristics comprise (i) at least one input data source, (ii) at least one data transformation, (iii) at least one model, and (iv) at least one model performance parameter, wherein the at least one machine-learning model is trained using the historical lineage data of the historical geo-spatial physical models, the historical lineage data identifying model characteristics for a corresponding historical geo-spatial physical model.

An additional aspect of the invention provides a computer program product for recommending model characteristics to be used in developing a target geo-spatial physical model for a target geographic location utilizing historical lineage data corresponding to historical geo-spatial physical models, the method comprising: a computer readable storage medium having computer readable program code embodied therewith, the computer readable program code executable by a processor and comprising: computer readable program code configured to receive information related to the target geographic location, wherein the information describes geographical and domain features of the target geographic location; computer readable program code configured to identify, using at least one similarity algorithm, at least one other geographic location that is similar to the target geographic location, wherein the at least one geographic location has at least one corresponding historical geo-spatial physical model; and computer readable program code configured to recommend, using at least one machine-learning model and based upon the at least one other geographic location, initial model characteristics for developing and deploying the target geo-spatial physical model, wherein the initial model characteristics comprise (i) at least one input data source, (ii) at least one data transformation, (iii) at least one model, and (iv) at least one model performance parameter, wherein the at least one machine-learning model is trained using the historical lineage data of the historical geo-spatial physical models, the historical lineage data identifying model characteristics for a corresponding historical geo-spatial physical model.

A further aspect of the invention provides a method, comprising: training at least one machine-learning model for geo-spatial physical modeling, wherein the training comprises (i) providing a plurality of historical geo-spatial models to the machine-learning model, (ii) providing deployment data corresponding to each of the plurality of historical geo-spatial models to the machine-learning model, and (iii) utilizing the plurality of historical geo-spatial models and corresponding deployment data to train the machine-learning model to identify (a) input data sources, (b) data transformations, (c) models, and (d) model parameters for geo-spatial physical models across different geographies; identifying a target geographic location for creation of a geo-spatial physical model for the target geographic location; and providing a recommendation regarding (iv) at least one input data source, (v) at least one data transformation, (vi) at least one model, and (vii) at least one model parameter for use within a geo-spatial physical model of the target geographic location, wherein the providing comprises (e) inputting information corresponding to the target geographic location to the at least one machine-learning model and (f) receiving an output from the at least one machine-learning model, the output being used within the recommendation.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
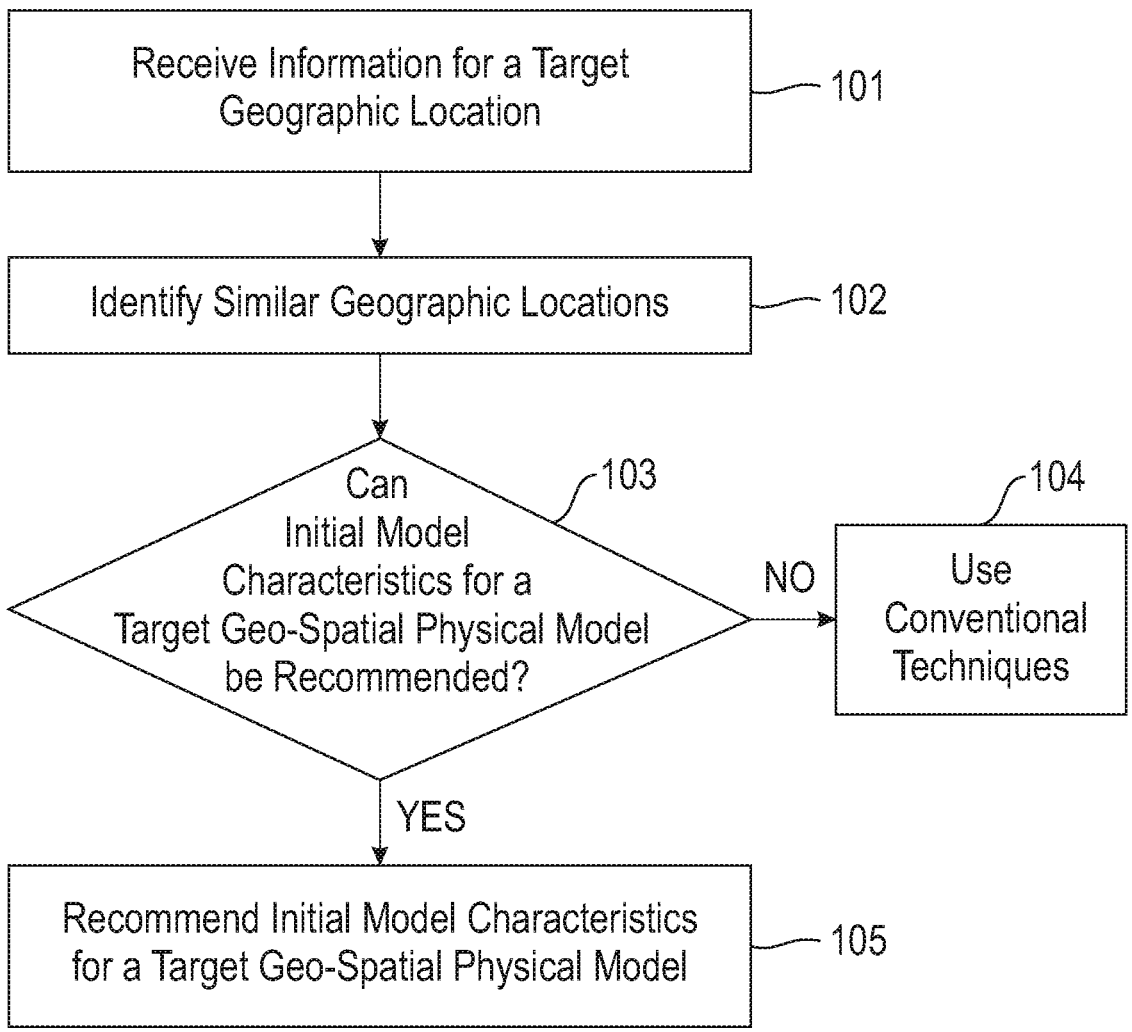
FIG. 1 illustrates a method for recommending model characteristics to be used in developing a target geo-spatial physical model for a target geographic location utilizing historical lineage data corresponding to historical geo-spatial physical models.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The illustrated embodiments of the invention will be best understood by reference to the figures. The following description is intended only by way of example and simply illustrates certain selected exemplary embodiments of the invention as claimed herein. It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will be made here below to FIGS. 1-2. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 2. In accordance with an example embodiment, most if not all of the process steps, components and outputs discussed with respect to FIG. 1 can be performed or utilized by way of a processing unit or units and system memory such as those indicated, respectively, at 16' and 28' in FIG. 2, whether on a server computer, a client computer, a node computer in a distributed network, or any combination thereof.

While geo-spatial physical models are very useful in different domains, the development and deployment of these models is very time and resource intensive. Traditionally, creating a geo-spatial physical model for a target geographic location involves multiple iterations and many trial and error runs. To help speed up the development and deployment process, a person or team creating the model may start with an existing model, for example, a model that has already been developed and deployed in an area having similar geographic and environmental features. However, even with this starting point, modifying and optimizing the physical model for the target geographic location still takes significant time and processing resources. Additionally, since many of these geo-spatial physical models are complex and made by coupling multiple models together, the development and deployment of these models is even more difficult, particularly for large systems.

Since no conventional technique exists to assist in determining what models or model characteristics should be utilized for a target geographic location, the developers generally rely on identification of other geographic locations that have similar geographic and environmental features as the target location. However, since many different factors can affect the suitability of a model for a particular geography, for example, land use, weather, spatial resolution, and the like, simply relying on geographic and environmental features may result in a starting model that is unsuitable for the target geographic location. Additionally, the domain or application of the model may affect the suitability of a model since different model types rely on different features of the geographic location. Thus, the conventional techniques of manually selecting a starting model and then iterating the model and running the model to determine if the model has been properly customized for the target geographic location is ineffective, cumbersome, and very time and resource intensive, particularly since selection of the model and model characteristics is complex and very difficult.

Accordingly, an embodiment provides a system and method for recommending model characteristics to be used in developing a target geo-spatial physical model for a target geographic location utilizing historical lineage data corresponding to historical geo-spatial physical models. The system receives information related to a target geographic location. The information describes geographical and domain features of the target geographic location, for example, location coordinates, spatial resolution, land use, terrain features, geographical region, cartographic projection, and the like. The system then identifies geographic locations that are similar to the target geographic location. Determining the similarity may be based upon comparing some or all of the geographical and domain features between geographic locations.

Each geographic location that is used as a comparison has a corresponding geo-spatial physical model that has already been deployed, also referred to as a historical geo-spatial physical model. From the historical model the system can access and extract lineage data that provide information regarding characteristics of the model, for example, data sources, sub-schemes, data transformations, performance characteristics, model parameters, hardware used to run the model, outputs, and the like. Thus, using the lineage data from the historical models, the system can make a recommendation for the target geographic location regarding not only what model and sub-models or sub-schemes should be used as an initial seed, but also the input data sources, data transformations, and model performance parameters that should be utilized as initial characteristics in developing the model.

To make this recommendation, the system uses a machine-learning model that has been trained using the historical lineage data of the historical geo-spatial physical models. The trained model is then able to take the input for the target geographical location, digest that input, and provide an output that is utilized in the recommendation for the model and characteristics of the model for the target geographical location. In other words, the machine-learning model is able to mine and extract relevant insights and information with respect to identifying a model and model characteristics that would be suitable as an initial seed for developing and deploying a geo-spatial physical model for a target geographic location.

Such a system provides a technical improvement over current systems for developing and deploying geo-spatial physical models. The described system and method train a machine-learning model utilizing lineage data from historical or already deployed geo-spatial physical models. The trained machine-learning model is then able to identify attributes of geographic locations that are attributes contributing to the functionality and accuracy of the model. From this training the machine-learning model is then able to identify the data sources, data transformations, models, including sub-schemes, and model parameters that would be best suited as an initial seed to be used in a target geographic location. Thus, instead of requiring manual selection, as in the conventional techniques, the described system and method can automate the selection of the initial seed. Additionally, the initial seed is much more likely to be suitable for the target geographic location since the initial seed is chosen based upon many different factors and not only geographic and environmental factors, as in the conventional techniques. Accordingly, the described system and method result in faster development and deployment of the models, and the developed and deployed models are initially more accurate as compared to models developed using conventional techniques.

FIG. 1 illustrates a method for recommending model characteristics to be used in developing a target geo-spatial physical model for a target geographic location utilizing historical lineage data corresponding to historical geo-spatial physical models. At 101, the system receives information related to the target geographic location. The information describes geographical and domain features of the target geographic location. The information may include, for example, location coordinates, terrain features, geographical region, spatial resolution, cartographic projection, land use, elevation, climate/weather classification, bodies of water, land cover, and the like. Additionally, the system may receive information related to the resources that are available for developing and deploying the model. For example, the system may receive information related to available software resources, available hardware resources, a desired accuracy, and the like. Receipt of the target geographic location and/or resource information may be by way of a person or user uploading the information to the system. A user may also provide a pointer or link to the location of the information for the system to retrieve therefrom. Additionally or alternatively, the information may be stored in a data storage location that the system has access to and the system can then pull the necessary information from the data storage location.

At 102, the system may identify at least one geographic location that is similar to the target geographic location. Identifying a similar geographic location may include utilizing at least one similarity algorithm, for example, similarity measures, cosine similarity, clustering techniques, affinity measurements, class distribution measures, and the like. In identifying the similarity, the system may compute a similarity score between the target geographic location and another geographic location. The similarity algorithm and, therefore, the similarity score may be based upon different information related to the geographic locations, for example, geographical features, domain features, and the like. Geographic locations having a similarity score above a predetermined threshold may be designated as similar geographic locations.

Additionally, since different domains utilize different models and, therefore, different information, the similarity algorithm and/or similarity score may be based upon information that is unique to the model domain. For example, if the model domain is fire prediction, the information may include fuel load type, historical fire information, and the like. As another example, if the model domain is soil moisture, the information may include soil texture, crop type, land use, and the like. Accordingly, since the different domains utilize different models, identification of a similar geography might be different based upon the model domain. In other words, one geographic location that is considered similar for one model domain may not be considered similar for a different model domain.

Each geographic location that is a candidate for similarity may have at least one corresponding historical geo-spatial physical model. In other words, each geographic location that is in the pool of possible similar geographic locations has at least one corresponding geo-spatial physical model that has already been deployed. Since the model has already been deployed, the model has lineage data associated with it. Lineage data include any data that are associated with the model. For example, lineage data may include information related to input data sets and sources thereof, data transformations that were performed on the inputs, models and sub-schemes or sub-models, model parameters, model runtime and scheme convergence, model performance metrics, physical hardware used to develop and/or deploy the model, any post-processing performed on the model outputs, any transformations performed on the model or model outputs, or the like.

Input data sets may include identification of a data source for a particular set of data used by the model. Some example data transformations include interpolation, mapping, extrapolation, and the like. Some example sub-schemes or sub-models include a physics sub-model, boundary layer sub-model, evapo-transpiration sub-model, cumulus physics sub-model, weather sub-model, and other sub-models that are generally dependent on the domain or application of the overall model. Some example model performance metrics may include accuracy metrics, computer resources, model stability and robustness parameters, failure data, and the like.

At 103, the system determines if initial model characteristics for developing and deploying a target geo-spatial physical model can be recommended. One model characteristic is an input data source. It should be understood that multiple input data sources may be recommended, for example, one input data source for each data set that will be incorporated into the model. Another model characteristic is one or more data transformations to be performed on the input datasets. Example data transformations include interpolation, extrapolation, mapping, and the like. Another model characteristic is an overall model and/or sub-schemes or sub-models to be incorporated into the overall model. Another model characteristic is a model performance parameter or metric that identifies desired output parameters, desired model parameters, necessary system resources or parameters, and the like. Thus, the initial characteristics may be similar to information found within lineage data of historical geo-spatial physical models.

To recommend initial model characteristics, the system uses at least one machine-learning model. The machine-learning model may be a supervised machine-learning model, semi-supervised machine learning model, analytic model, or any other type of machine-learning model. In order for the machine-learning model to make recommendations, the machine-learning model is trained using historical lineage data corresponding to the historical geo-spatial physical models. In other words, the historical geo-spatial models are provided to the machine-learning model for training the model. Additionally, deployment or lineage data are provided to the machine-learning model. The machine-learning model then uses the historical geo-spatial models and corresponding deployment or lineage data as training data, for example, in a supervised, semi-supervised, or other training manner.

Since the deployment or lineage data include all information corresponding to the deployed models, including the information related to the geographic location (e.g., environmental features, geographic features, etc.) that the models were developed and deployed for, the machine-learning model can extract and mine insights and relevant information from the models and lineage data. For example, the machine-learning model can learn what attributes, features, or lineage data types are most relevant for particular geographic locations, model domains, or the like, and use these attributes for recommending initial model characteristics. In other words, the system can weight different types of lineage data and utilize the lineage data having the highest weightings, for example, the top-k lineage data types, in making the recommendations.

The information for the target geographic location is provided to the trained machine-learning model. The machine-learning model then digests and analyzes the information to make recommendations regarding initial model characteristics that should be used for a geo-spatial physical model for the target geographic location. The model characteristics included in the recommendation include a model and any sub-schemes or sub-models, input data sources, data transformations, and model performance parameters. In the event that initial model characteristics cannot be recommended at 103, the system may use conventional manual techniques for selecting an initial model and model characteristics 104. The inability to recommend initial model characteristics may occur, for example, if there is not a geographic location that has a historical geo-spatial model that is similar to the target geographic location. In another example, the system may only be able to make partial recommendations regarding the initial model characteristics. The system may output these partial recommendations and the developer may then use manual or conventional techniques for selecting the other characteristics.

If, on the other hand, the system determines that initial model characteristics can be recommended at 103, the system may make recommendations for those initial model characteristics at 105. The recommendations may be based upon a predetermined number of highest ranking historical geo-spatial physical models. The historical geo-spatial physical models may be ranked based upon a similarity to the target geographic location, a number of highest ranking lineage data included in a historical geo-spatial model, or any other technique for ranking the physical models, for example, a ranking technique provided by a user, a default ranking technique, or the like.

Once the recommendations are made, the system may set the target geo-spatial physical model with the initial model characteristics as an initial seed for development and deployment of the target geo-spatial physical model. The model can then be tuned. For example, the system or model developer can modify the initial characteristics. However, since the developer is able to start with a selected initial seed, the development and the deployment of the model is much faster and more effective than conventional systems. Additionally, once the model is developed and deployed, the model and lineage data can be provided back to the machine-learning model as an additional training set, thereby making the machine-learning model more accurate. In other words, once the model is developed and deployed, the initial model characteristics, performance results, final model characteristics, and other lineage data, can be incorporated into the machine-learning model.

Thus, the described system and method represent a technical improvement over current systems for developing geo-spatial physical models. Rather than a developer manually selecting a seed model based upon geographic and environmental features, the described system and method is able to automate the selection of the seed model. Additionally, the described system and method are able to recommend parameters, data sources, and data transformations that should be utilized with the model. Thus, instead of the time and resource intensive manual technique that generally results in subpar initial model selections, the described system and method is able to provide the model characteristics using a technique that requires less time and resources than the conventional manual methods and results in initial model selections that are more accurate with respect to the target geographic location in view of the model type. Accordingly, the described system and technique results in the development and deployment of geo-spatial physical models much quicker and more effectively than conventional techniques.

Figure 2:
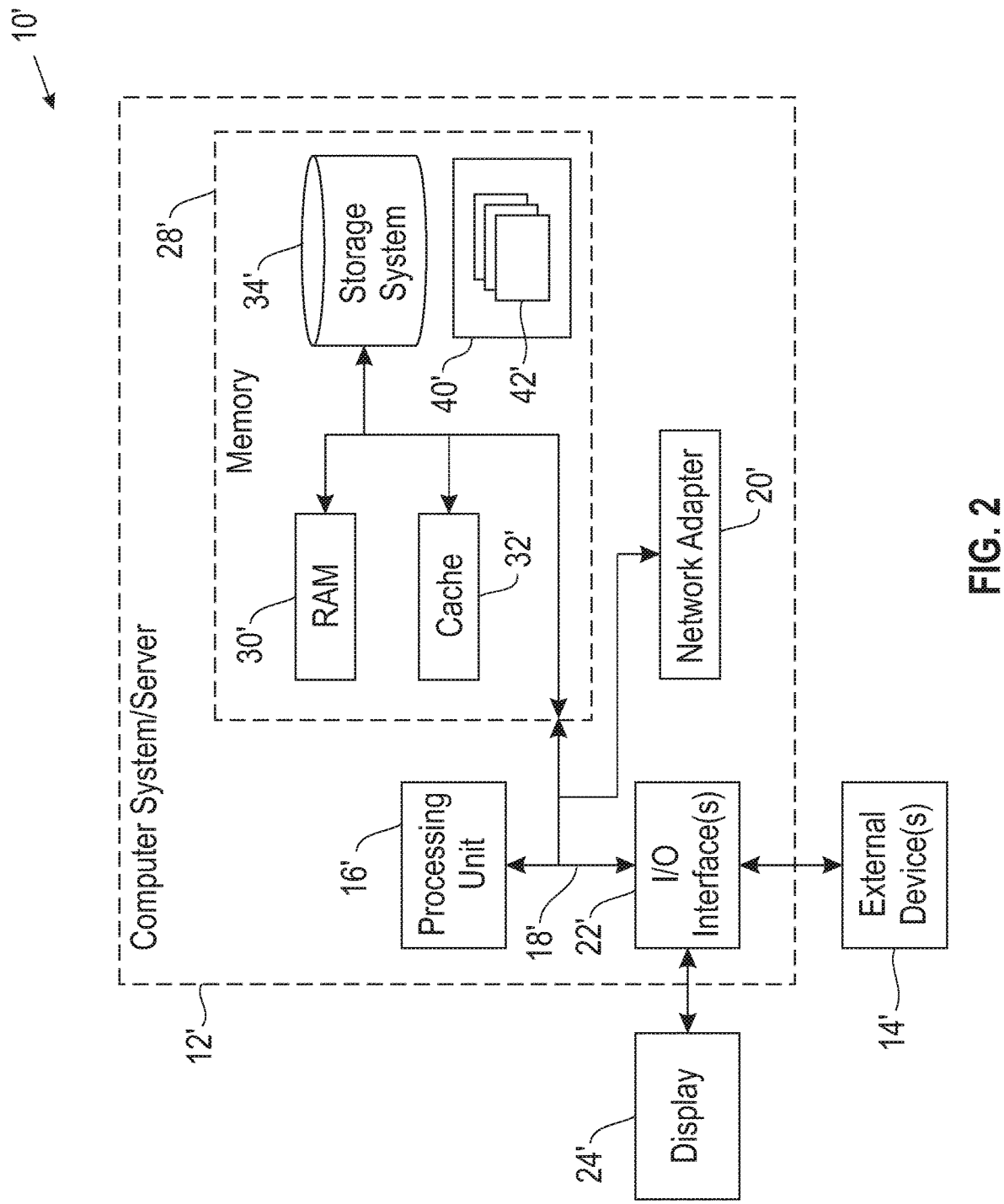
FIG. 2 illustrates a computer system.

As shown in FIG. 2, computer system/server 12' in computing node 10' is shown in the form of a general-purpose computing device. The components of computer system/server 12' may include, but are not limited to, at least one processor or processing unit 16', a system memory 28', and a bus 18' that couples various system components including system memory 28' to processor 16'. Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12'; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for developing a target geo-spatial physical model, the method comprising:
   receiving information related to a target geographic location, wherein the information describes geographical and domain features of the target geographic location;
   identifying, using at least one similarity algorithm, at least one other geographic location that is similar to the target geographic location, wherein the at least one other geographic location has at least one corresponding historical geo-spatial physical model; and
   recommending model characteristics, using at least one machine-learning model having a historical lineage data corresponding to the at least one other geographic location, and initial model characteristics, for developing and deploying the target geo-spatial physical model, wherein the initial model characteristics identify information corresponding to the target geo-spatial physical model and comprise (i) at least one input data source for the target geo-spatial physical model, (ii) at least one data transformation to be used within the target geo-spatial physical model, and (iii) at least one model performance parameter for the target geo-spatial physical model;
   training said machine learning model using the historical lineage data of the historical geospatial physical models and the initial model characteristics to produce one or more target geo-spatial physical models;
   producing the target geo-spatial physical model for the target geographic location based on the recommendations for model characteristics for developing and deploying the target geo-spatial physical model;
   using the produced target geo-spatial physical model for one of weather forecasting, air pollution predicting, forest fire predicting, flood forecasting and soil moisture estimation to make best use of land.

2. The method of claim 1, wherein said at least one machine learning model comprises a target geo-spatial physical model and is trained using the historical lineage data of the historical geo-spatial physical models, the historical lineage data identifying model characteristics for a corresponding historical geo-spatial physical model, wherein the historical lineage data utilized to train the at least one machine-learning model is selected from different types of lineage data by weighting the different types of lineage data based upon attributes that are most relevant for the target geographic location and wherein the historical lineage data comprises a number of the different types of lineage data having a highest weighting.

3. The method of claim 2, wherein the identifying comprises computing a similarity score between the target geographic location and other geographic locations and the similarity score is based upon a domain of the target geo-spatial physical model; and
   wherein the at least one other geographic location comprises a geographic location having a similarity score above a predetermined threshold and different domains result in different similarity scores for the target geographic location and another geographical location.

4. The method of claim 1, wherein the recommendation is based upon a predetermined number of highest ranking historical geo-spatial physical models.

5. The method of claim 1, wherein the at least one machine-learning model identifies types of lineage data having a weighting above a predetermined threshold with respect to the developing the target geo-spatial physical model; and wherein the recommendation is based upon the identified types of lineage data.

6. The method of claim 1, comprising setting the target geo-spatial physical model with the initial model characteristics as an initial seed for development of the target geo-spatial physical model and further tuning the target geo-spatial physical model by modifying the initial model characteristics.

7. The method of claim 1, comprising (i) developing and deploying the target geo-spatial physical model utilizing the initial model characteristics, (ii) receiving performance results from the deployment, and (iii) incorporating the performance results and final model characteristics into training of the at least one machine-learning model.

8. The method of claim 1, wherein the at least one model included in the recommendation comprises sub-schemes used within an overall model.

9. The method of claim 1, wherein the geographical and domain features comprise at least one of: location coordinates, terrain features, geographical region, spatial resolution, cartographic projection, and land use.

10. An apparatus for developing a target geo-spatial physical model, the apparatus comprising:

at least one processor; and a computer readable storage medium having computer readable program code embodied therewith and executable by the at least one processor, the computer readable program code comprising:

target geographic location, wherein the information describes geographical and domain features of the target geographic location;

computer readable program code configured to identify, using at least one similarity algorithm, at least one other geographic location that is similar to the target geographic location, wherein the at least one other geographic location has at least one corresponding historical geo-spatial physical model; and computer readable program code configured to recommend, model characteristics, using at least one machine-learning model having a historical lineage data corresponding to the at least one other geographic location, and initial model characteristics, for developing and deploying the target geo-spatial physical model, wherein the initial model characteristics identify information corresponding to the target geo-spatial physical model and comprise (i) at least one input data source for the target geo-spatial physical model, (ii) at least one data transformation to be used within the target geo-spatial physical model, and (iii) at least one model performance parameter for the target geo-spatial physical model;

computer readable program code configured to train said machine learning model using the historical lineage data of the historical geospatial physical models and the initial model characteristics to produce one or more target geo-spatial physical models;

computer readable program code configured to produce the target geo-spatial physical model for the target geographic location based on the recommendations for model characteristics for developing and deploying the target geo-spatial physical model; and computer readable program code configured to use the produced target geo-spatial physical model for one of weather forecasting, air pollution predicting, forest fire predicting, flood forecasting and soil moisture estimation to make best use of land.

11. A computer program product for developing a target geo-spatial physical model, the computer program product comprising:

a computer readable storage medium having computer readable program code embodied therewith, the computer readable program code executable by a processor and comprising:

computer readable program code configured to receive information related to a target geographic location, wherein the information describes geographical and domain features of the target geographic location;

computer readable program code configured to identify, using at least one similarity algorithm, at least one other geographic location that is similar to the target geographic location, wherein the at least one other geographic location has at least one corresponding historical geo-spatial physical model; and computer readable program code configured to recommend, model characteristics, using at least one machine-learning model having a historical lineage data corresponding to the at least one other geographic location, and initial model characteristics, for developing and deploying the target geo-spatial physical model, wherein the initial model characteristics identify information corresponding to the target geo-spatial physical model and comprise (i) at least one input data source for the target geo-spatial physical model, (ii) at least one data transformation to be used within the target geo-spatial physical model, and (iii) at least one model performance parameter for the target geo-spatial physical model;

computer readable program code configured to train said machine learning model using the historical lineage data of the historical geospatial physical models and the initial model characteristics to produce one or more target geo-spatial physical models;

computer readable program code configured to produce the target geo-spatial physical model for the target geographic location based on the recommendations for model characteristics for developing and deploying the target geo-spatial physical model; and computer readable program code configured to use the produced target geo-spatial physical model for one of weather forecasting, air pollution predicting, forest fire predicting, flood forecasting and soil moisture estimation to make best use of land.

12. The computer program product of claim 11, wherein said at least one machine learning model comprises a target geo-spatial physical model and is trained using the historical lineage data of the historical geo-spatial physical models, the historical lineage data utilized to train the at least one machine-learning model is selected from different types of lineage data by weighting the different types of lineage data based upon attributes that are most relevant for the target geographic location and wherein the historical lineage data comprises a number of the different types of lineage data having a highest weighting.

13. The computer program product of claim 12, wherein the identifying comprises computing a similarity score between the target geographic location and other geographic locations and the similarity score is based upon a domain of the target geo-spatial physical model; and
 wherein the at least one other geographic location comprises a geographic location having a similarity score above a predetermined threshold and different domains result in different similarity scores for the target geographic location and another geographical location.

14. The computer program product of claim 11, wherein the recommendation is based upon a predetermined number of highest ranking historical geo-spatial physical models.

15. The computer program product of claim 11, wherein the at least one machine-learning model identifies types of lineage data having a weighting above a predetermined threshold with respect to the developing and deploying the target geo-spatial physical model, and
 wherein the recommendation is based upon the identified types of lineage data.

16. The computer program product of claim 11, comprising setting the target geo-spatial physical model with the initial model characteristics as an initial seed for development of the target geo-spatial physical model and further tuning the target geo-spatial physical model by modifying the initial model characteristics.

17. The computer program product of claim 11, comprising (i) developing and deploying the target geo-spatial physical model utilizing the initial model characteristics, (ii) receiving performance results from the deployment, and (iii) incorporating the performance results and final model characteristics into training of the at least one machine-learning model.

18. The computer program product of claim 11, wherein the at least one model included in the recommendation comprises sub-schemes used within an overall model.

19. The computer program product of claim 11, wherein the geographical and domain features comprise at least one of: location coordinates, terrain features, geographical region, spatial resolution, cartographic projection, and land use.

20. A method, comprising:
 training at least one machine-learning model for geo-spatial physical modeling, wherein the training comprises (i) providing a plurality of historical geo-spatial models to the machine-learning model, (ii) providing deployment data corresponding to each of the plurality of historical geo-spatial models to the machine-learning model, and (iii) utilizing the plurality of historical geo-spatial models and corresponding deployment data to train the machine-learning model to identify (a) input data sources, (b) data transformations, (c) models, and (d) model parameters for geo-spatial physical models across different geographies, wherein the training comprises utilizing historical lineage data identified from the historical geo-spatial models and the deployment data, wherein the historical lineage data is selected from different types of lineage data by weighting the different types of lineage data based upon attributes that are most relevant for the geo-spatial physical models and wherein the historical lineage data comprises a number of the different types of lineage data having a highest weighting;
 identifying a target geographic location for creation of a geo-spatial physical model for the target geographic location; and
 providing a recommendation for model characteristics, using at least one machine-learning model having a historical lineage data corresponding to the at least one other geographic location, and initial model characteristics, for developing and deploying the target geo-spatial physical model, wherein the initial model characteristics identify information corresponding to the target geo-spatial physical model and comprise (iv) at least one input data source for the target geo-spatial physical model, (v) at least one data transformation to be used within the target geo-spatial physical model, (vi) at least one model to be used for the target geo-spatial physical model and (vii) at least one model performance parameter for the target geo-spatial physical model, wherein the providing comprises (e) inputting information corresponding to the target geographic location to the at least one machine-learning model and (f) receiving an output from the at least one machine-learning model, the output being used within the recommendation;
 training said machine learning model using the historical lineage data of the historical geospatial physical models and the initial model characteristics to produce one or more target geo-spatial physical models;
 producing the target geo-spatial physical model for the target geographic location based on the recommendation for model characteristics for developing and deploying the target geo-spatial physical model;
 using the produced target geo-spatial physical model for one of weather forecasting, air pollution predicting, forest fire predicting, flood forecasting and soil moisture estimation to make best use of land.

* * * * *